United States Patent
Kim et al.

(10) Patent No.: US 8,319,223 B2
(45) Date of Patent: Nov. 27, 2012

(54) THIN FILM TRANSISTOR ARRAY PANEL USING ORGANIC SEMICONDUCTOR AND A METHOD FOR MANUFACTURING THE SAME

(75) Inventors: Bo Sung Kim, Seoul (KR); Mun-Pyo Hong, Seongnam-si (KR); Min-Seong Ryu, Suwon-si (KR); Yong-Uk Lee, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 12/971,872

(22) Filed: Dec. 17, 2010

(65) Prior Publication Data

US 2011/0084260 A1  Apr. 14, 2011

Related U.S. Application Data

(62) Division of application No. 10/927,225, filed on Aug. 27, 2004, now Pat. No. 7,880,170.

(30) Foreign Application Priority Data

Aug. 28, 2003 (KR) .................................. 2003-60014

(51) Int. Cl.
*H01L 29/76* (2006.01)
(52) U.S. Cl. ................. 257/66; 257/40; 257/72
(58) Field of Classification Search .......... 257/40, 257/57, 59, 66, 72
See application file for complete search history.

(56) References Cited

U.S. PATENT DOCUMENTS

| | | | |
|---|---|---|---|
| 4,322,524 A | 3/1982 | Onda et al. | |
| 5,574,291 A | 11/1996 | Dodabalapur et al. | |
| 6,045,743 A * | 4/2000 | Iwai et al. | 264/345 |
| 6,114,088 A | 9/2000 | Wolk et al. | |
| 6,300,988 B1 | 10/2001 | Ishihara et al. | |
| 6,429,053 B1 | 8/2002 | Yamazaki et al. | |
| 6,621,098 B1 | 9/2003 | Jackson et al. | |
| 6,833,896 B2 * | 12/2004 | Lee | 349/141 |
| 6,885,146 B2 | 4/2005 | Yamazaki et al. | |
| 6,953,947 B2 | 10/2005 | Son et al. | |
| 7,015,502 B2 | 3/2006 | Arai et al. | |
| 2002/0179901 A1 | 12/2002 | Arai et al. | |

FOREIGN PATENT DOCUMENTS

| | | |
|---|---|---|
| JP | 2001-244467 | 9/2001 |
| JP | 2002-110999 | 4/2002 |
| JP | 2002-322173 | 11/2002 |
| JP | 2002-359374 | 12/2002 |
| JP | 2003-086805 | 3/2003 |
| JP | 2003-098548 | 4/2003 |
| KR | 1019980032958 A | 7/1998 |
| KR | 1020030017748 A | 8/2001 |
| KR | 1020020092242 A | 5/2002 |
| KR | 1020020084427 A | 11/2002 |
| KR | 1020020092242 A | 12/2002 |
| KR | 1020030017748 A | 3/2003 |
| WO | 00/36666 | 6/2000 |
| WO | 03/023877 | 3/2003 |

* cited by examiner

*Primary Examiner* — Ori Nadav
(74) *Attorney, Agent, or Firm* — Cantor Colburn LLP

(57) ABSTRACT

The present invention disclosed an organic thin film transistor, an organic thin film transistor array substrate and an organic thin film transistor display. The present invention disclosed organic materials which is proper for the application to a large screen display. The presentation also disclosed structures and a method for manufacturing such an organic thin film transistor, the organic thin film transistor array substrate and the organic thin film transistor display.

3 Claims, 13 Drawing Sheets ic thin film transistor (TFT) array panel using an organic semiconductor and the manufacturing method thereof.

THIN FILM TRANSISTOR ARRAY PANEL USING ORGANIC SEMICONDUCTOR AND A METHOD FOR MANUFACTURING THE SAME

CROSS-REFERENCE TO RELATED APPLICATIONS

This application is a divisional application of U.S. application Ser. No. 10/927,225, filed on Aug. 27, 2004, which claims priority to Korean Patent Application No. 2003-0060014, filed on Aug. 28, 2003, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel using an organic semiconductor and the manufacturing method thereof.

(b) Description of the Related Art

Thin and flat panel displays like a liquid crystal display (LCD) and an organic light emitting display (OLED) are popular these days. In manufacturing LCD and OLED, metal layers are deposited by sputtering. Insulating layers or semiconductor layers are made by chemical vapor deposition (CVD). Sputtering and CVD steps in manufacturing an LCD or an OLED makes it difficult to achieve a uniform display quality throughout the whole display area. That's why an LCD and an OLED cannot be made as large as a plasma display panel (PDP).

SUMMARY OF THE INVENTION

The present invention discloses an organic thin film transistor (TFT), an organic thin film transistor array substrate and an organic thin film transistor display. The present invention discloses organic materials proper for applying to a large screen display. The present invention discloses insulating materials that is proper for an organic thin film transistor. The present invention also discloses a method for treating an insulator surface. The present invention improves the TFT characteristics. The specification also discloses structures and manufacturing method of the organic thin film transistor, the organic thin film transistor array substrate and the organic thin film transistor display.

BRIEF DESCRIPTION OF THE DRAWINGS

The present invention will become more apparent by describing embodiments in detail with reference to the accompanying drawings.

DETAILED DESCRIPTION OF THE PREFERRED EMBODIMENTS

Figure 1:
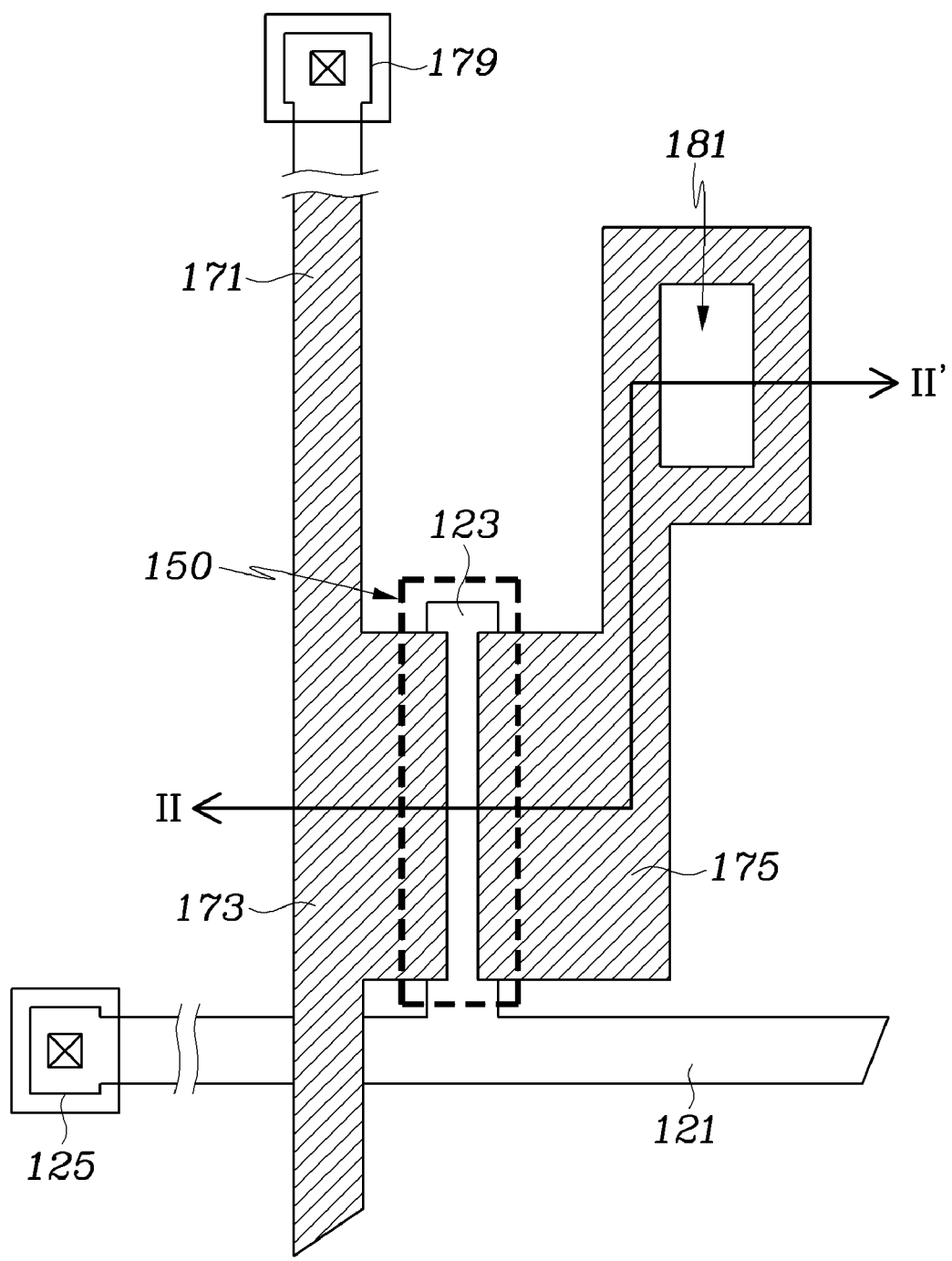
FIG. 1 is a layout view of a thin film transistor (TFT) array panel of using an organic semiconductor according to an exemplary embodiment of the present invention.

The details of the present invention will be described hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

An electric field effect transistor using an organic semiconductor is researched as a driving device of the next generation display.

Organic semiconductor materials may be classified into low molecule materials and high molecule materials. The low molecule materials include oligothiophene, pentacene, phthalocyanine and C60. The high molecule materials include polythiophene and polythienylenevinylene.

The low molecule organic semiconductor materials have a high mobility in a range of about 0.05-1.5 msV and superior on/off current ratio. However, forming process of the low molecule semiconductors is complicate since a shadow mask and vacuum deposition are used to form a low molecule semiconductor pattern. Accordingly, the low molecule semiconductors have demerit for mass production.

On the contrary, the high molecule semiconductor have rather low mobility in a range of about 0.001-0.1 msV but have merit for mass production and applying to wide display since the high molecule organic semiconductor materials are soluble to a solvent and the high molecule semiconductor solutions are possible to be coated or to be printed.

Now, TFT array panels and manufacturing methods thereof according to exemplary embodiments of the present invention will be described with reference to the accompanying drawings.

Figure 2:
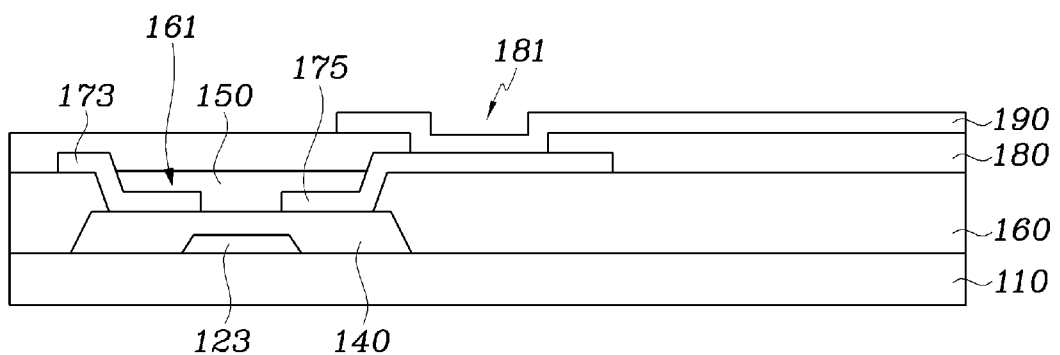
FIG. 2 is a sectional view of the TFT array panel shown in FIG. 1 taken along the line II-II'.

FIG. 1 is a layout view of a thin film transistor (TFT) array panel of using an organic semiconductor according to an exemplary embodiment of the present invention. FIG. 2 is a sectional view of the TFT array panel shown in FIG. 1 taken along the line II-II'.

Referring to FIGS. 1 and 2, a TFT array panel according to an exemplary embodiment of the present invention is now described in detail.

A plurality of gate lines 121 are formed on an insulating substrate 110. The gate lines 121 extend substantially in a transverse direction and are separated from each other. The gate lines 121 transmit gate signals. A plurality of projections of each gate line 121 forms a plurality of gate electrodes 123. Each gate line 121 has a pad 125 for contact with another layer or an external device.

A plurality of gate insulator 140 is partially formed on the gate electrodes 123. The gate insulators 140 are $SiO_2$ islands of which surfaces are treated by octadecyl-trichloro-silane (OTS).

A wall insulating layer 160 is formed on the gate insulators 140 and the insulating substrate 110. The wall insulating layer 160 is made of an organic insulator or inorganic insulator such as SiNx.

The wall insulating layer 160 has a plurality of trenches 161 of which lateral side is inclined to a degree with respect to the surface of the substrate 110.

A plurality of data lines 171 and drain electrodes 175 are formed on the gate insulators 140 and the wall insulating layer 160.

The data lines 171 for transmitting data voltages extend substantially in the longitudinal direction and intersect the gate lines 121 to define pixel areas arranged in a matrix. Each data line 171 includes a pad 179 that is wider than other area of data line for contacting another layer or an external device. A plurality of branches of each data line 171, which project toward the drain electrodes 175, form a plurality of source electrodes 173. Each pair of the source electrodes 173 and the drain electrodes 175 is separated from each other and opposite each other with respect to a gate electrode 123.

The source electrode 173 and the drain electrode 175 are formed to extend from inside to outside of the trench 161. Accordingly, the source electrode 173 and the drain electrode 175 partially overlap the gate electrode 123 while insulated by the gate insulator 140.

A plurality of organic semiconductor island 150 is formed in the trenches 161. The shape of the organic semiconductor islands 150 are regulated by the trenches 161.

The trenches 161 limit the shape and location of the organic semiconductor islands 150. Accordingly the organic semiconductor islands 150 have regulated shape and location even though drop size or drop place of organic semiconductor droplets are irregular during printing. In other word, the trenches 161 are frames of the organic semiconductor islands 150.

High or low molecule semiconductors that are soluble to water or organic solvents may be used as the organic semiconductor. The high molecule semiconductors are well adapted to a printing process, since they are pretty much soluble. Some of the low molecule semiconductors that are soluble to a organic solvent can be used as the organic semiconductor.

The organic semiconductor island 150 may be made of one of tetracene, derivative including substituent of pentacene, and oligothiophene formed by connecting connection location number 2 and 5 of four to eight thiophene ring.

The organic semiconductor island 150 may be made of one of perylenetetracarboxylic dianhydride (PTCDA), imide derivative of PTCDA, napthalenetetracarboxylic dianhydride (NTCDA), and imide derivative of NTCDA.

The organic semiconductor island 150 may be made of one of metallized pthalocyanine, derivative halide of metallized pthalocyanine, perylene, coroene, and derivatives including substituent of coroene. Metal included in metallized pthalocyanine is preferably one of copper (Cu), cobalt (Co), and zinc (Zn).

The organic semiconductor island 150 may be made of co-oligomer or co-polymer of thienylene and vinylene.

The organic semiconductor island 150 may be made of thiophene.

The organic semiconductor island 150 may be made of one of perylene, coroene, and derivative including substituent of perylene and coroene.

The organic semiconductor island 150 may be made of derivative including aromatic or heteromatic ring of those derivative and one or more of hydrocarbon chain having one to thirty carbon.

A passivation layer 180 having a plurality of contact holes 181 exposing the drain electrodes 175 is formed on the wall insulating layer 160 and organic semiconductor islands 150.

A plurality of pixel electrode 190 connected to the drain electrodes 175 through the contact holes 181 is formed on the passivation layer 180.

Operation of the organic TFT is described below. The exemplary TFT has a P type semiconductor.

When no voltage is applied among the gate electrode 123, the source electrode 173, and the drain electrode 175, electric charges are uniformly dispersed in the organic semiconductor island 150. When a voltage is applied between the source electrode 173 and the drain electrode 175, current flows in proportion to the voltage as long as the voltage is low.

When a positive voltage is applied to the gate electrode 123, holes are driven to upward by the electric field. Accordingly, a depletion layer that has no conductive electric charge is formed near the gate insulator. At this time, a voltage applied between the source electrode 173 and the drain electrode 175 would flow less current than when no voltage is applied to the gate electrode 123, since conductive electric charges are depleted. On the other hand, when a negative voltage is applied to the gate electrode 123, holes are driven to downward by the electric field. Accordingly, a accumulation layer that has enough conductive electric charge is formed near the gate insulator 140. At this time, a voltage applied between the source electrode 173 and the drain electrode 175 would flow more current than when no voltage is applied to the gate electrode 123, since conductive electric charges are accumulated Therefore, amount of current flowing between the source electrode 173 and the drain electrode 175 can be controlled by applying positive voltage or negative voltage to the gate electrode 123. The ratio of on current versus off current is called on/off ratio. The larger the on/off ratio is, the better the TFT is.

A method for manufacturing the TFT array panel shown in FIGS. 1 and 2 will be described in detail below.

FIGS. 3A, 3B, 3C, 3D, 3E and 3F are sectional views of the TFT array panel shown in FIGS. 1 and 2 through various steps of a manufacturing method according to an exemplary embodiment of the present invention.

Figure 3A:
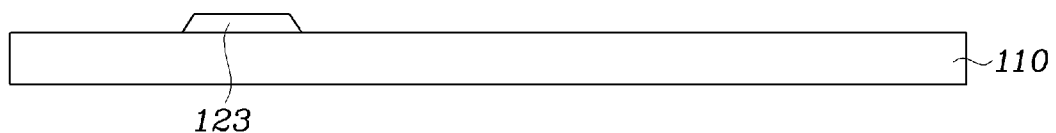
FIGS. 3A, 3B, 3C, 3D, 3E, and 3F are sectional views of the TFT array panel shown in FIGS. 1 and 2 during various steps of a manufacturing method thereof according to an exemplary embodiment of the present invention.

Referring to FIG. 3A, a conductive layer is sputtered on an insulating substrate 110 and is etched by photolithography method to form a plurality of gate lines 121 including a plurality of gate electrode 123. The insulating substrate 110 may be made of one of glass, silicon, and plastic. The gate lines 121 may be made of a metal such as gold silver, aluminum, chrome or an alloy of those.

Figure 3B:
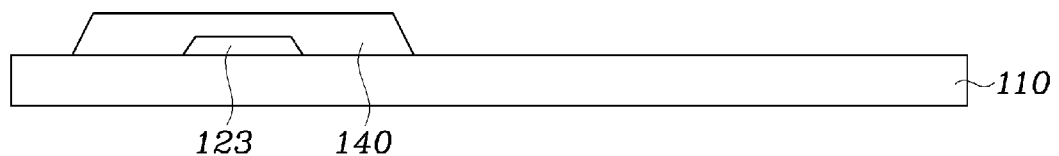

Referring to FIG. 3B, a plurality of gate insulators 140 are formed on the gate electrodes 123 and the insulating substrate 110. The gate insulators 140 are formed by depositing an insulating layer made of insulating material such as SiNx and $SiO_2$, photo-etching the insulating layer to form a plurality of insulating islands on and around the gate electrodes 123, and treating surface of the insulating islands by OTS. The insulating layer may be deposited by chemical vapor deposition (CVD) and about 500 to 3,000 Å thick.

Figure 3C:
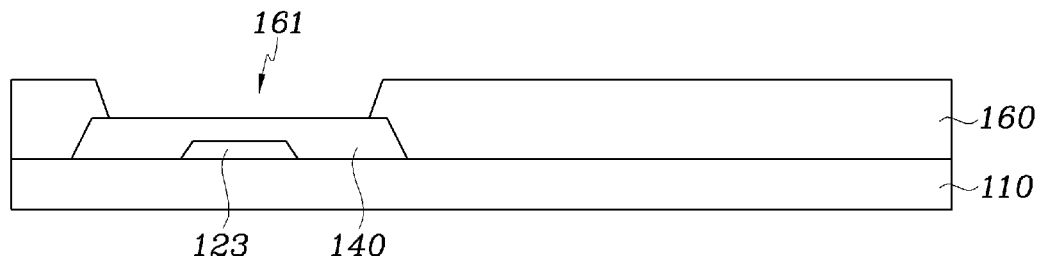

Referring to FIG. 3C, a wall insulating layer 160 is formed on the gate insulators 140 and the gate lines 121. The wall insulating layer 160 is formed by depositing an insulating layer made of such as $SiN_x$, $SiO_2$, and organic insulator and photo-etching the insulating layer to form trenches 161. The trenches 161 expose portions of the gate insulators 140 and preferably have inclined lateral side. The trenches 161 are frames to regulate the shape and location of printed organic semiconductor.

Figure 3D:
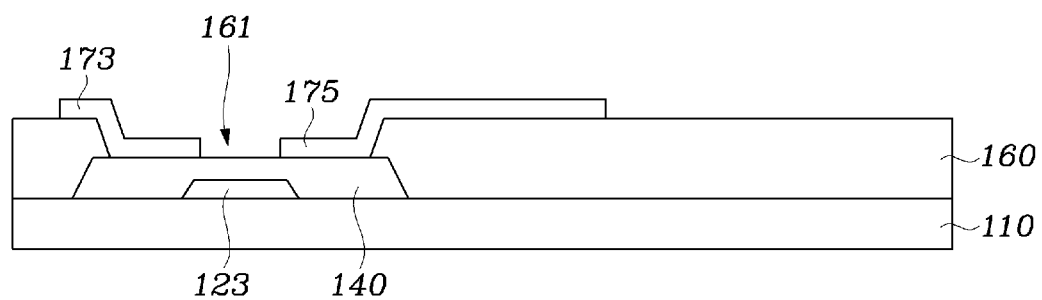

Referring to FIG. 3D, a conductive layer of such as gold is deposited on the gate insulator 140 and the wall insulating layer 160 by vacuum thermal deposition and is photo-etched to form a plurality of data lines 171 including source electrodes 173 and drain electrodes 175.

Figure 3E:
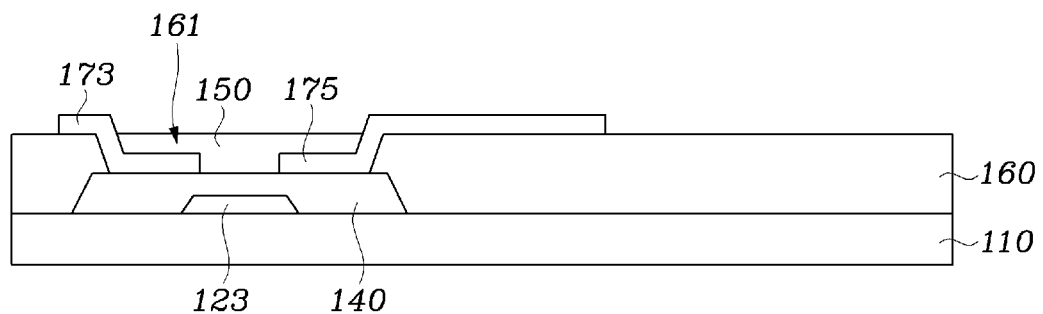

Referring to FIG. 3E, organic semiconductor is printed in the trenches 161 to form organic semiconductor islands 150. The organic semiconductor island 150 is formed by dropping liquid state organic semiconductor. Therefore, if there is no frame, the organic semiconductor island may be formed in a variety shapes and locations depending on size of the organic semiconductor droplet. However, the organic semiconductor islands 150 have substantially fixed shape and location because the trench 161 works as a frame. The organic semiconductor is crystallized by heating.

Figure 3F:
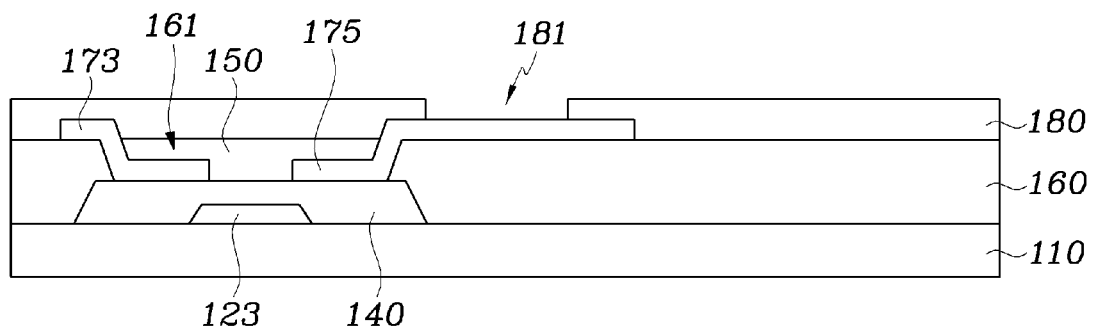

Referring to FIG. 3F, a passivation layer 180 is formed on the organic semiconductor islands 150, the wall insulating layer 160, the data lines 171, and the drain electrodes 175 to have contact holes 181 exposing the drain electrode 175.

Next, a plurality of pixel electrodes 190 are formed on the passivation layer 180 to be connected with the drain electrodes 175 through the contact holes 181.

Figure 4:
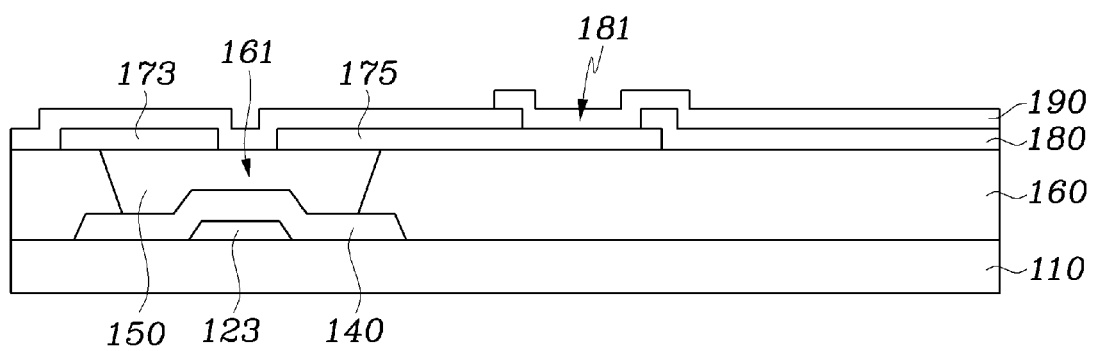
FIG. 4 is a sectional view of the TFT array panel shown in FIG. 1 taken along the line II-II' according to another exemplary embodiment of the present invention.

An organic semiconductor TFT array panel according to another embodiment of the present invention will be described in detail with reference to FIG. 4. In FIG. 4, the same reference numeral represents the same member as in FIGS. 1 and 2.

FIG. 4 is a sectional view of the TFT array panel shown in FIG. 1 taken along the line II-II' according to another exemplary embodiment of the present invention.

Referring to FIGS. 1 and 4, A plurality of gate lines 121 are formed on an insulating substrate 110. The gate lines 121 extend substantially in a transverse direction and are separated from each other. The gate lines 121 transmit gate signals. A plurality of projections of each gate line 121 forms a plurality of gate electrodes 123. Each gate line 121 has a pad 125 for contacting another layer or an external device.

A plurality of gate insulator 140 is partially formed on the gate electrodes 123. The gate insulators 140 are $SiO_2$ islands of which surfaces are treated by octadecyl-trichloro-silane (OTS).

A wall insulating layer 160 is formed on the gate insulators 140 and the insulating substrate 110. The wall insulating layer 160 is made of an organic insulator or inorganic insulator such as SiNx.

The wall insulating layer 160 has a plurality of trenches 161 of which lateral side is inclined to a degree with respect to the surface of the substrate 110.

A plurality of organic semiconductor island 150 is formed in the trenches 161, which mold the shape of the organic semiconductor islands 150.

The trench 161 works as a frame to limit the shape and location of the organic semiconductor islands 150. Accordingly the organic semiconductor islands 150 have regulated shape and location even though drop size or drop place of organic semiconductor droplets are irregular during printing. In other word, the trenches 161 are molds for the organic semiconductor islands 150.

High or low molecule semiconductors that are soluble to water or organic solvents may be used as the organic semiconductor. The high molecule semiconductors are well adapted to a printing process, since they are very soluble. Some of the low molecule semiconductors that solve well in an organic solvent can be used as the organic semiconductor.

The examples of organic semiconductors are suggested in the description of the embodiment of FIGS. 1 and 2.

A plurality of data lines 171 and drain electrodes 175 are formed on the organic semiconductor island 150 and the wall insulating layer 160.

The data lines 171 for transmitting data voltages extend substantially in the longitudinal direction and intersect the gate lines 121 to define pixel areas arranged in a matrix. Each data line 171 includes a pad 179 that is wider for contacting another layer or an external device. A plurality of branches of each data line 171, which project toward the drain electrodes 175 form a plurality of source electrodes 173. Each pair of the source electrodes 173 and the drain electrodes 175 is separated from each other and opposite each other with respect to a gate electrode 123 and on the organic semiconductor island 150.

A passivation layer 180 having a plurality of contact holes 181 exposing the drain electrodes 175 is formed on the data lines 171 and the drain electrodes 175.

A plurality of pixel electrodes 190 connected to the drain electrodes 175 through the contact holes 181 are formed on the passivation layer 180.

When the embodiment of FIGS. 1 and 4 is compared with the embodiment of FIGS. 1 and 2, it is distinguishing feature that the source electrode 173 and the drain electrode 175 are formed on the organic semiconductor island 150.

A method of manufacturing the TFT array panel shown in FIGS. 1 and 4 will be described in detail.

FIGS. 5A, 5B, 5C, 5D, 5E and 5F are sectional views of the TFT array panel shown in FIGS. 1 and 4 through various steps of a manufacturing method thereof according to another exemplary embodiment of the present invention.

Figure 5A:
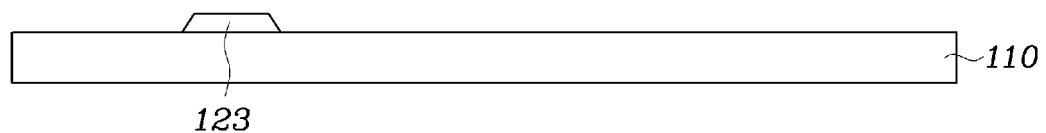
FIGS. 5A, 5B, 5C, 5D, 5E and 5F are sectional views of the TFT array panel shown in FIGS. 1 and 4 during various steps of a manufacturing method thereof according to an exemplary embodiment of the present invention.

Referring to FIG. 5A, a conductive layer is sputtered on an insulating substrate 110 and is patterned by photolithography to form a plurality of gate lines 121 including a plurality of gate electrode 123. The insulating substrate 110 may be made of one of glass, silicon, and plastic. The gate lines 121 may be made of a metal such as gold, silver, aluminum and etc.

Figure 5B:
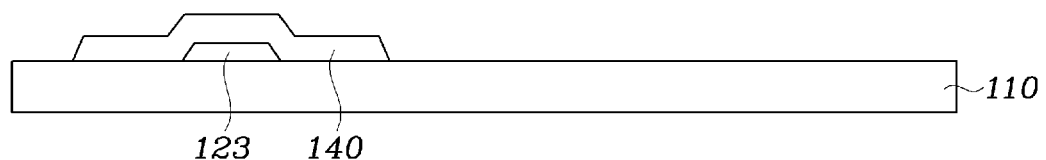

Referring to FIG. 5B, a plurality of gate insulators 140 are formed on the gate electrodes 123 and the insulating substrate 110. The gate insulators 140 are formed by depositing an insulating layer made of insulating material such as SiNx and $SiO_2$, photo-etching the insulating layer to form a plurality of insulating islands on and around the gate electrodes 123, and treating surface of the insulating islands by OTS. The insulating layer may be deposited by chemical vapor deposition (CVD) and about 500 to 3,000 Å thickness.

Figure 5C:
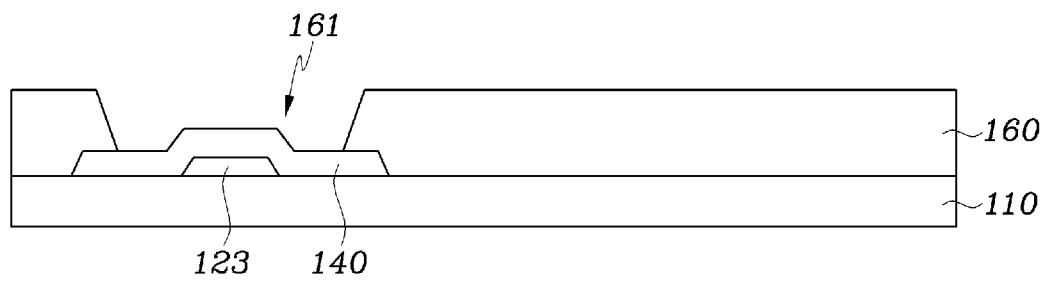

Referring to FIG. 5C, a wall insulating layer 160 is formed on the gate insulators 140 and the gate lines 121. The wall insulating layer 160 is formed by depositing an insulating layer made of such as $SiN_x$, $SiO_2$, and organic insulator and photo-etching the insulating layer to form trenches 161. The trenches 161 expose portions of the gate insulators 140 and preferably have inclined lateral side. The trenches 161 mold the shape and determine the location of printed organic semiconductor.

Figure 5D:
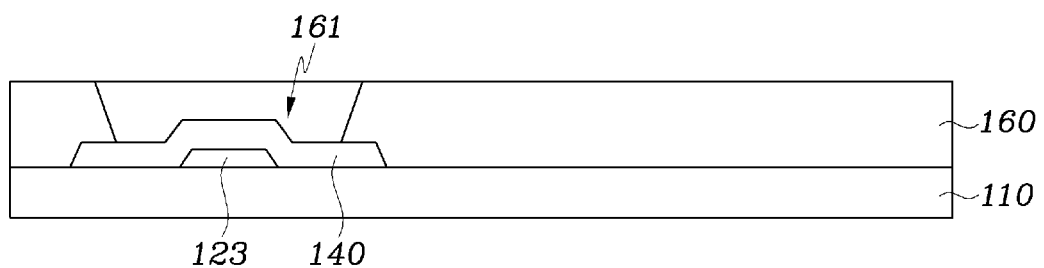

Referring to FIG. 5D, organic semiconductor is printed in the trenches 161 to form organic semiconductor islands 150. The organic semiconductor island 150 is formed by dropping liquid state organic semiconductor. Without a mold, the organic semiconductor island may be formed in a variety shapes and locations depending on size of the droplet. However, the organic semiconductor islands 150 have substantially fixed shape and location because the trenches 161 play a role of frames. The organic semiconductor is crystallized by heating.

Figure 5E:
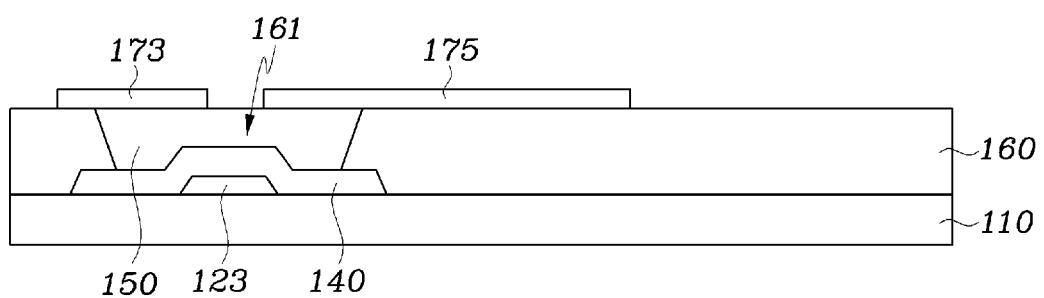

Referring to FIG. 5E, a conductive layer, such as gold, is deposited on the organic semiconductor islands 150 and the wall insulating layer 160 by vacuum thermal deposition and patterned by photolithography to form a plurality of data lines 171 including source electrodes 173 and drain electrodes 175.

Figure 5F:
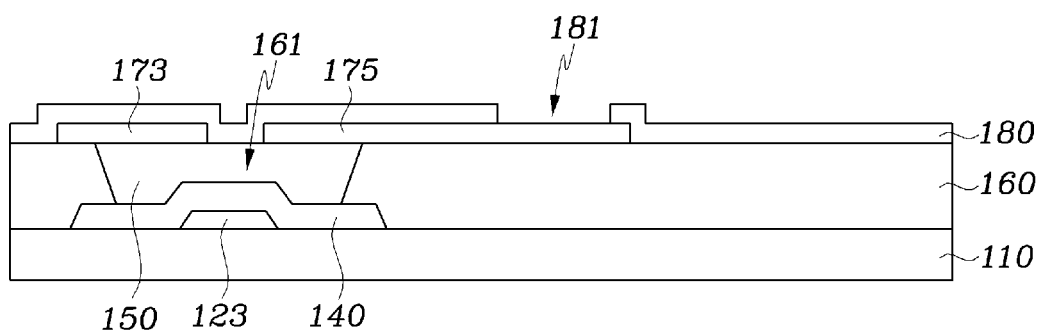

Referring to FIG. 5F, a passivation layer 180 is formed on the organic semiconductor islands 150, the wall insulating layer 160, the data lines 171, and the drain electrodes 175 to have contact holes 181 exposing the drain electrode 175.

Next, a plurality of pixel electrodes 190 are formed on the passivation layer 180 to be connected with the drain electrodes 175 through the contact holes 181.

As described above, the organic semiconductor island 150 formed on the OTS surface-treated gate insulator 140 improves crystalline of the organic semiconductor island 150, which in turn improves the TFT performance.

Embodiments of using a peculiar organic insulator instead of OTS treated SiO2 will be described hereinafter.

Figure 6:
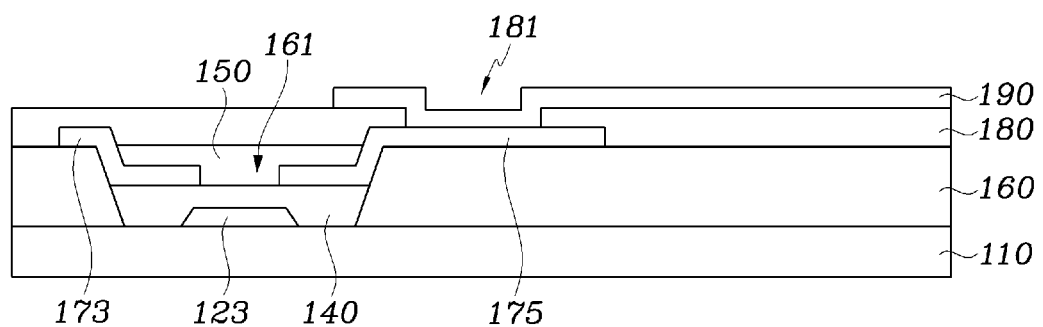
FIG. 6 is a sectional view of the TFT array panel shown in FIG. 1 taken along the line II-II' according to another exemplary embodiment of the present invention.

FIG. 6 is a sectional view of the TFT array panel shown in FIG. 1 taken along the line II-II' according to another exemplary embodiment of the present invention.

Referring to FIGS. 1 and 6, a plurality of gate lines 121 are formed on an insulating substrate 110. The gate lines 121 extend substantially in a transverse direction and are separated from each other. The gate lines 121 transmit gate signals. A plurality of projections of each gate line 121 forms a plurality of gate electrodes 123. Each gate line 121 has a pad 125 for contacting another layer or an external device.

A wall insulating layer 160 is formed on the insulating substrate 110. The wall insulating layer 160 is made of an organic insulator or inorganic insulator such as SiNx.

The wall insulating layer 160 has a plurality of trenches 161 of which lateral side is inclined to a degree with respect to the surface of the substrate 110.

The trenches 161 expose the gate electrodes 123.

A plurality of gate insulators 140 are formed in the trenches 161. The gate insulators 140 are made of organic material such as maleimide-styrene that is copolymer of permutated maleimide and permutated styrene, polyvinylphenol (PVP), and modified cyanoethylpullulan (m-CEP). Maleimide-styrene is described by the formula 1. Modified cyanoethylpullulan (m-CEP) is made by reforming the material described by the formula 2 and supplied by Shin-Etsu Co. of Japan.

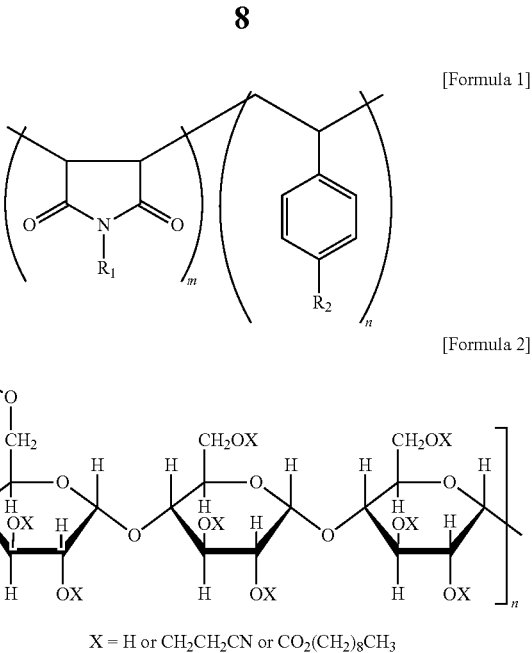

X = H or $CH_2CH_2CN$ or $CO_2(CH_2)_8CH_3$

Such organic materials preferably have higher dielectric constant than the wall insulating layer 160.

A plurality of data lines 171 and drain electrodes 175 are formed on the gate insulators 140 and the wall insulating layer 160. The data lines 171 for transmitting data voltages extend substantially in the longitudinal direction and intersect the gate lines 121 to define pixel areas arranged in a matrix. Each data line 171 includes a pad 179 that is wider for contacting another layer or an external device. A plurality of branches of each data line 171, which project toward the drain electrodes 175, form a plurality of source electrodes 173. Each pair of the source electrodes 173 and the drain electrodes 175 is separated from each other and opposite each other with respect to a gate electrode 123.

The source electrode 173 and the drain electrode 175 are formed to extend from inside to outside of the trench 161. Accordingly, the source electrode 173 and the drain electrode 175 partially overlap the gate electrode 123 while they are insulated by the gate insulator 140.

A plurality of organic semiconductor islands 150 are formed in the trenches 161 and on the source electrode 173 and the drain electrode 175. The shape of the organic semiconductor islands 150 are molded by the trenches 161.

The trenches 161 works as mold to form the shape and location of the organic semiconductor islands 150. Accordingly the organic semiconductor islands 150 have a shape and location even though size of organic semiconductor droplets are irregular during printing. In other word, the trenches 161 are frames of the organic semiconductor islands 150.

High or low molecule semiconductors that are soluble to water or organic solvents may be used as the organic semiconductor. The high molecule semiconductors are well adapted to a printing process, since they solve well in a solvent. Some of the low molecule semiconductors that solve well in an organic solvent can be used as organic semiconductor.

Examples of organic semiconductor are suggested in the description of the embodiment of FIGS. 1 and 2.

A passivation layer 180 having a plurality of contact holes 181 exposing the drain electrodes 175 is formed on the data lines 171 and the drain electrodes 175.

A plurality of pixel electrode 190 connected to the drain electrodes 175 through the contact holes 181 is formed on the passivation layer 180.

A method for manufacturing the TFT array panel shown in FIGS. 1 and 6 will be now described in detail.

FIGS. 7A, 7B, 7C, 7D, 7E and 7F are sectional views of the TFT array panel shown in FIGS. 1 and 6 through various steps of a manufacturing method thereof according to an exemplary embodiment of the present invention.

Figure 7A:
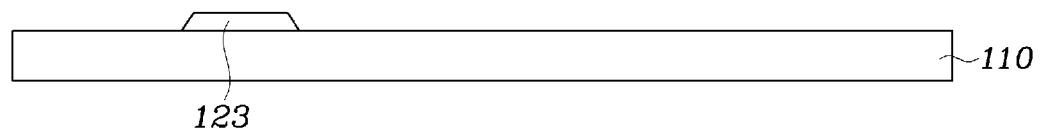
FIGS. 7A, 7B, 7C, 7D, 7E and 7F are sectional views of the TFT array panel shown in FIGS. 1 and 6 during various steps of a manufacturing method thereof according to an exemplary embodiment of the present invention.

Referring to FIG. 7A, a conductive layer is sputtered on an insulating substrate 110 and is patterned to form a plurality of gate lines 121 including a plurality of gate electrode 123. The insulating substrate 110 may be made of glass, silicon, or plastic and the gate lines 121 may be made of a metal such as gold.

Figure 7B:
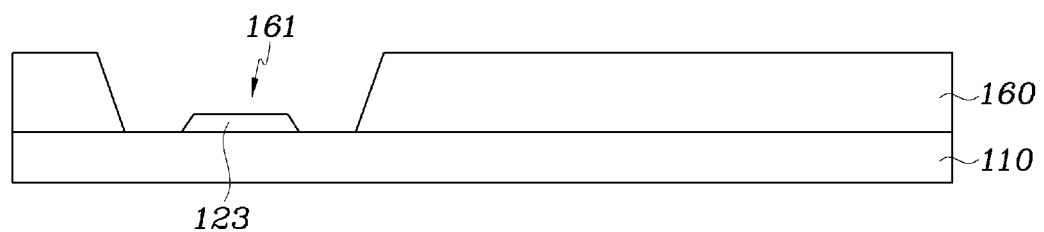

Referring to FIG. 7B, a wall insulating layer 160 is formed on the insulating substrate 110 and the gate lines 121. The wall insulating layer 160 is formed by depositing an insulating layer made of such as $SiN_x$, $SiO_2$, and organic insulator and photo-etching the insulating layer to form trenches 161. The trenches 161 expose portions of the gate insulators 140 and preferably have inclined lateral side. The trenches 161 are frames to regulate the shape and location of printed organic semiconductor.

Figure 7C:
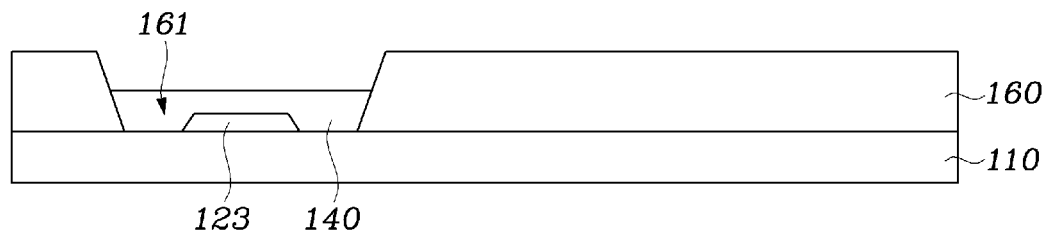

Referring to FIG. 7C, a plurality of gate insulators 140 are formed in the trench 161 and on the gate electrodes 123 and the insulating substrate 110. The gate insulators 140 are formed by printing organic material such as maleimide-styrene that is copolymer of permutated maleimide and permutated styrene, polyvinylphenol (PVP), and modified cyanoethylpullulan (m-CEP).

Figure 7D:
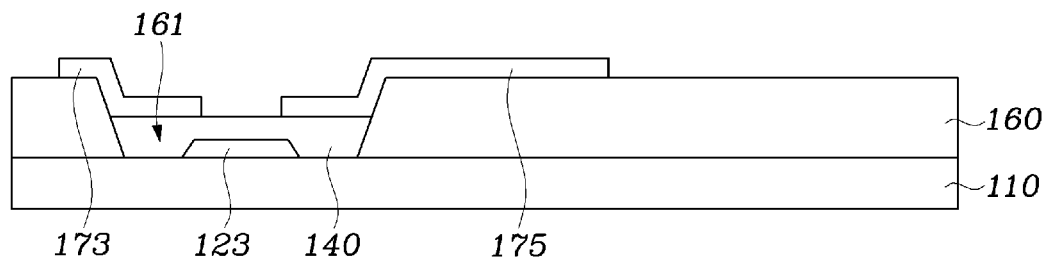

Referring to FIG. 7D, a conductive layer of such as gold is deposited on the gate insulator 140 and the wall insulating layer 160 by vacuum thermal deposition and is photo-etched to form a plurality of data lines 171 including source electrodes 173 and drain electrodes 175.

Figure 7E:
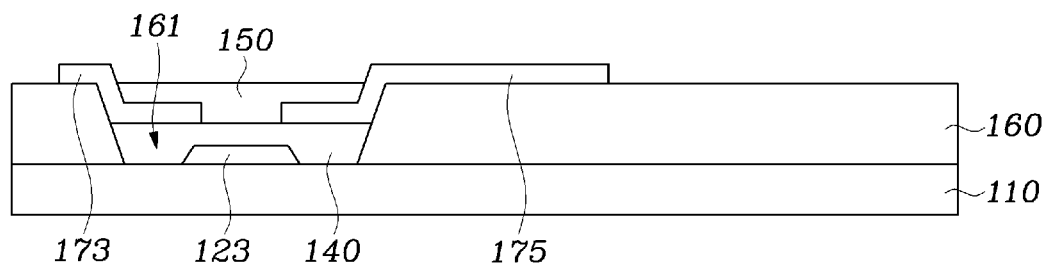

Referring to FIG. 7E, organic semiconductor is printed in the trenches 161 to form organic semiconductor islands 150. The organic semiconductor island 150 is formed by dropping liquid state organic semiconductor. Therefore, if there is no frame, the organic semiconductor island may be formed in a variety of shapes and locations depending on size of the organic semiconductor droplet. However, the organic semiconductor islands 150 have a certain shape and location because the trenches 161 play a role of frames. The organic semiconductor is crystallized by being heated after being dropped.

Figure 7F:
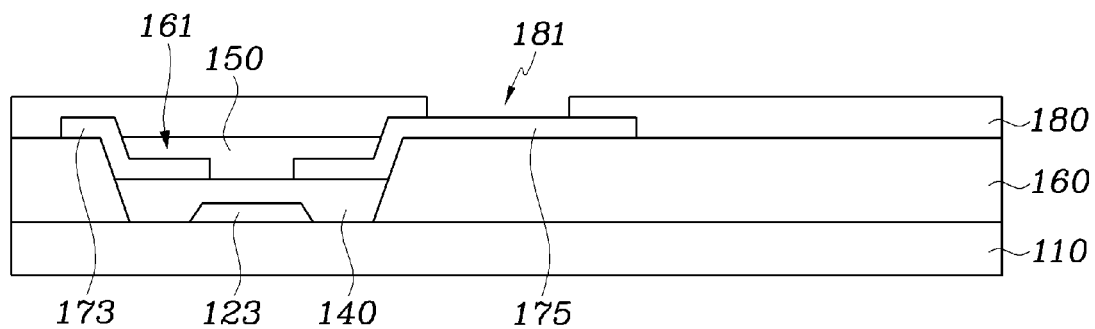

Referring to FIG. 7F, a passivation layer 180 is formed on the organic semiconductor islands 150, the wall insulating layer 160, the data lines 171, and the drain electrodes 175 to have contact holes 181 exposing the drain electrode 175.

Next, a plurality of pixel electrodes 190 are formed on the passivation layer 180 to be connected with the drain electrodes 175 through the contact holes 181.

Figure 8:
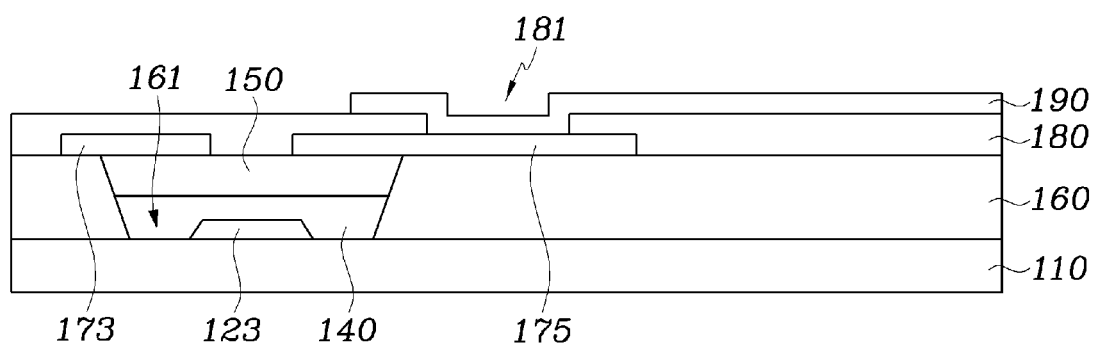
FIG. 8 is a sectional view of the TFT array panel shown in FIG. 1 taken along the line II-II' according to another exemplary embodiment of the present invention.

FIG. 8 is a sectional view of the TFT array panel shown in FIG. 1 taken along the line II-II' according to another exemplary embodiment of the present invention.

Referring to FIGS. 1 and 8, a plurality of gate lines 121 are formed on an insulating substrate 110. The gate lines 121 extend substantially in a transverse direction and are separated from each other. The gate lines 121 transmit gate signals. A plurality of projections of each gate line 121 forms a plurality of gate electrodes 123. Each gate line 121 has an expansion 125 for contact with another layer or an external device.

A wall insulating layer 160 is formed on the insulating substrate 110. The wall insulating layer 160 is made of an organic insulator or inorganic insulator such as SiNx.

The wall insulating layer 160 has a plurality of trenches 161 of which lateral side is inclined to a degree with respect to the surface of the substrate 110. The trenches 161 expose the gate electrodes 123.

A plurality of gate insulators 140 are formed in the trenches 161. The gate insulators 140 are made of organic material such as maleimide-styrene that is copolymer of permutated maleimide and permutated styrene, polyvinylphenol (PVP), and modified cyanoethylpullulan (m-CEP).

A plurality of organic semiconductor islands 150 are formed in the trenches 161 and on the gate insulator 140. The trenches 161 shapes the organic semiconductor islands 150.

The trenches 161 frame the shape and location of the organic semiconductor islands 150. Accordingly the organic semiconductor islands 150 have regulated shape and location even though drop size or drop place of organic semiconductor droplets are irregular during printing. In other word, the trenches 161 are frames of the organic semiconductor islands 150.

High or low molecule semiconductors that are soluble to water or organic solvents may be used as the organic semiconductor. The high molecule semiconductors are well adapted to a printing process, since they solve well in a solvent. Some of the low molecule semiconductors solving well in an organic solvent can also be used as organic semiconductor.

The examples of organic semiconductor are suggested in the description of the embodiment of FIGS. 1 and 2.

A plurality of data lines 171 and drain electrodes 175 are formed on the organic semiconductor island 150 and the wall insulating layer 160.

The data lines 171 for transmitting data voltages extend substantially in the longitudinal direction and intersect the gate lines 121 to define pixel areas arranged in a matrix. Each data line 171 includes a pad 179 that is wide for contacting another layer or an external device. A plurality of branches of each data line 171, which project toward the drain electrodes 175 form a plurality of source electrodes 173. Each pair of the source electrodes 173 and the drain electrodes 175 is separated from each other and opposite each other with respect to a gate electrode 123 and on the organic semiconductor island 150.

A passivation layer 180 having a plurality of contact holes 181 exposing the drain electrodes 175 is formed on the data lines 171 and the drain electrodes 175.

A plurality of pixel electrode 190 connected to the drain electrodes 175 through the contact holes 181 is formed on the passivation layer 180.

When the embodiment of FIGS. 1 and 8 is compared with the embodiment of FIGS. 1 and 6, it is distinguishing feature that the source electrode 173 and the drain electrode 175 are formed on the organic semiconductor island 150.

A method for manufacturing the TFT array panel shown in FIGS. 1 and 8 will be now described in detail.

FIGS. 9A, 9B, 9C, 9D, 9E and 9F are sectional views of the TFT array panel shown in FIGS. 1 and 8 during various steps according to an exemplary embodiment of the present invention.

Figure 9A:
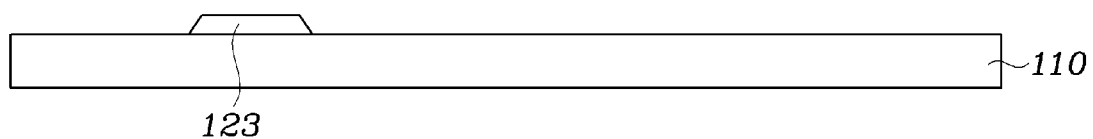
FIGS. 9A, 9B, 9C, 9D, 9E and 9F are sectional views of the TFT array panel shown in FIGS. 1 and 8 during various steps of a manufacturing method thereof according to an exemplary embodiment of the present invention.

Referring to FIG. 9A, a conductive layer is sputtered on an insulating substrate 110 and is photo-etched to form a plurality of gate lines 121 including a plurality of gate electrode 123. The insulating substrate 110 may be made of glass, silicon, or plastic and the gate lines 121 may be made of a metal such as gold.

Figure 9B:
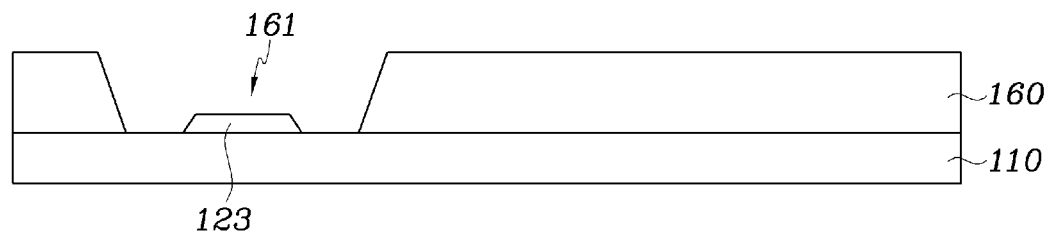

Referring to FIG. 9B, a wall insulating layer 160 is formed on the insulating substrate 110 and the gate lines 121. The wall insulating layer 160 is formed by depositing an insulating layer made of such as $SiN_x$, $SiO_2$, and organic insulator and photo-etching the insulating layer to form trenches 161. The trenches 161 expose portions of the gate insulators 140 and preferably have inclined lateral side. The trenches 161 frame the shape and location of printed organic semiconductor.

Figure 9C:
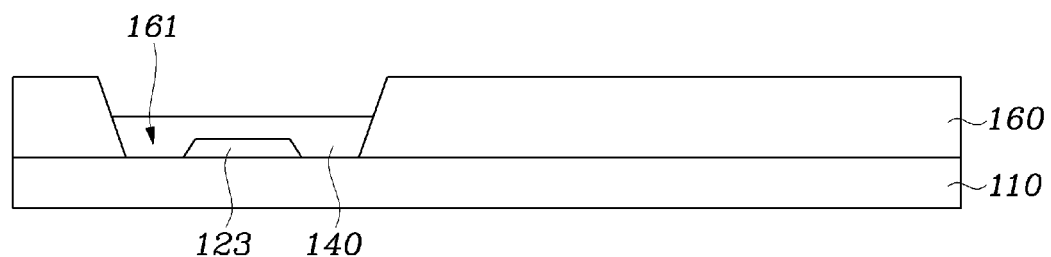

Referring to FIG. 9C, a plurality of gate insulators 140 are formed in the trench 161 and on the gate electrodes 123 and the insulating substrate 110. The gate insulators 140 are formed by printing organic material such as maleimide-styrene that is copolymer of permutated maleimide and permutated styrene, polyvinylphenol (PVP), and modified cyanoethylpullulan (m-CEP).

Figure 9D:

Referring to FIG. 9D, organic semiconductor is printed in the trenches 161 and on the gate insulator 140 to form organic semiconductor islands 150. The organic semiconductor island 150 is formed by dropping liquid state organic semiconductor. Therefore, if there is no frame, the organic semiconductor island may be formed in various shapes and locations depending on size of the organic semiconductor droplet. However, the organic semiconductor islands 150 have substantially fixed shape and location because the trenches 161 works as frames. The organic semiconductor is crystallized by heating.

Figure 9E:
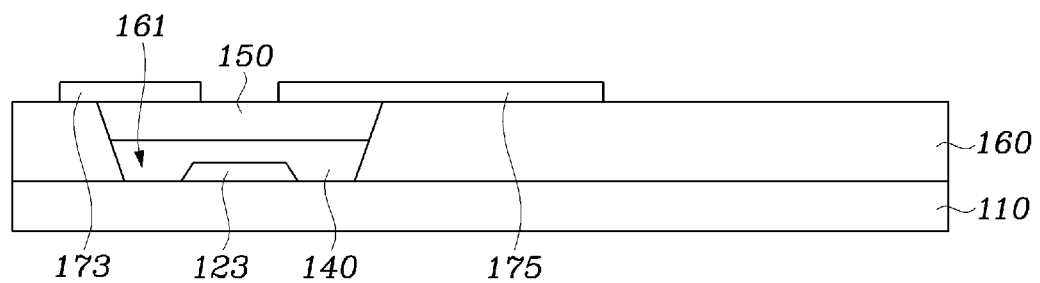

Referring to FIG. 9E, a conductive layer of such as gold is deposited on the organic semiconductor islands 150 and the wall insulating layer 160 by vacuum thermal deposition and is patterned to form a plurality of data lines 171 including source electrodes 173 and drain electrodes 175.

Figure 9F:
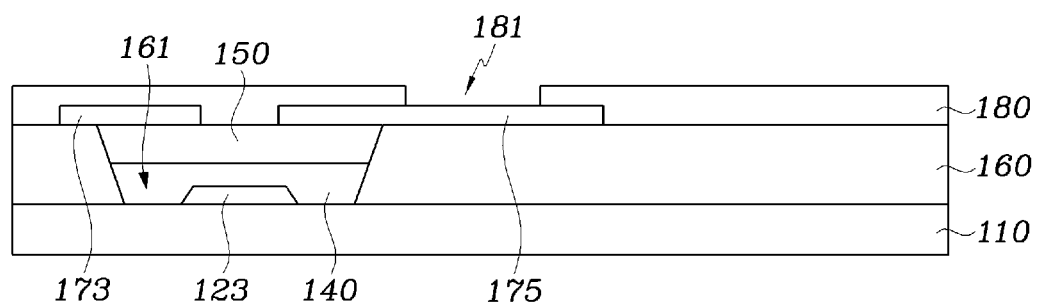

Referring to FIG. 9F, a passivation layer 180 is formed on the organic semiconductor islands 150, the wall insulating layer 160, the data lines 171, and the drain electrodes 175 to have contact holes 181 exposing the drain electrode 175.

Next, a plurality of pixel electrodes 190 are formed on the passivation layer 180 to be connected with the drain electrodes 175 through the contact holes 181.

As described above, the organic semiconductor island 150 formed on the gate insulator 160 made of peculiar organic material such as maleimide-styrene, polyvinylphenol (PVP), and modified cyanoethylpullulan (m-CEP) improves crystalline of the organic semiconductor island 150, which in turn improves TFT performance.

Figure 10:
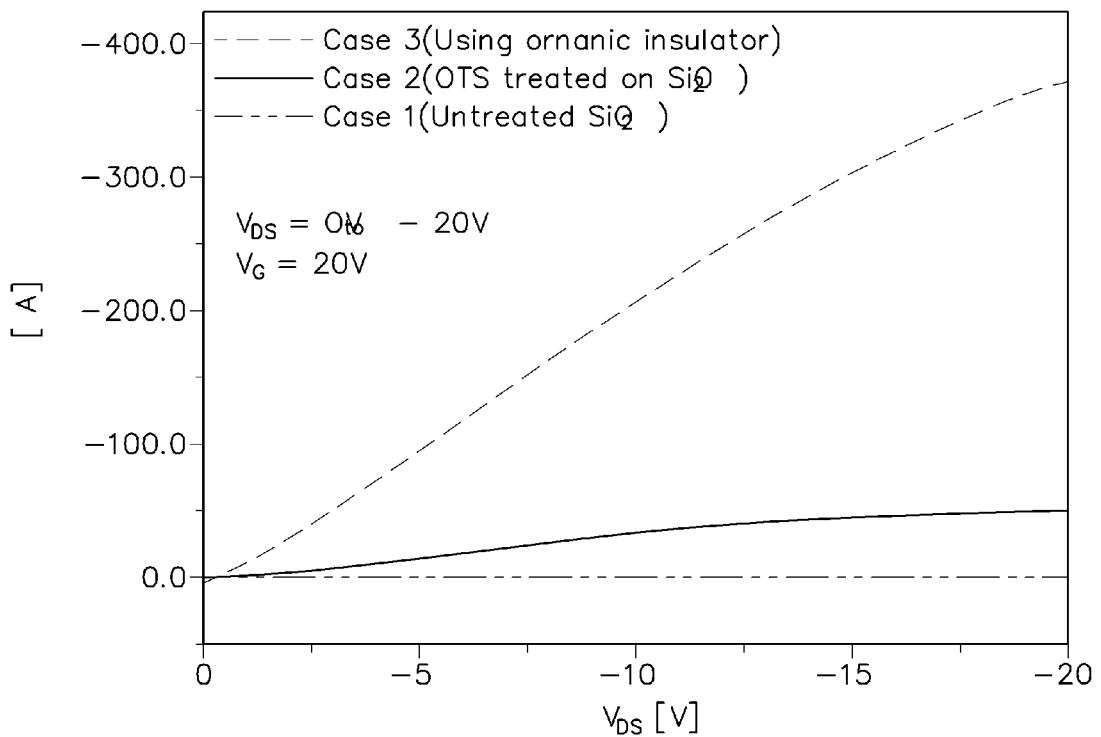
FIG. 10 is a graph showing I-V curves of TFTs according to embodiments of the present invention.

FIG. 10 is a graph showing I-V curves of TFTs according to embodiments of the present invention and a conventional one.

In FIG. 10, $V_{DS}$ represents the voltage applied between the source electrode and the drain electrode and varies from 0V to −20V. $V_G$ represents the voltage applied to the gate electrode and is 20V. I represents the current flowing between the source electrode and the drain electrode.

Referring to FIG. 10, case 2 (using OTS treated SiO2 as a gate insulator) shows improved I-V curve as compared with case 1 (using untreated SiO2 as a gate insulator) and case 3 (using an organic material such as maleimide-styrene, PVP, and m-CEP) shows much more improved I-V curve as compared with case 2.

This improvement of I-V curve comes from that crystalline difference of organic semiconductor is induced depending on the surface condition of under layer.

Figure 11A:
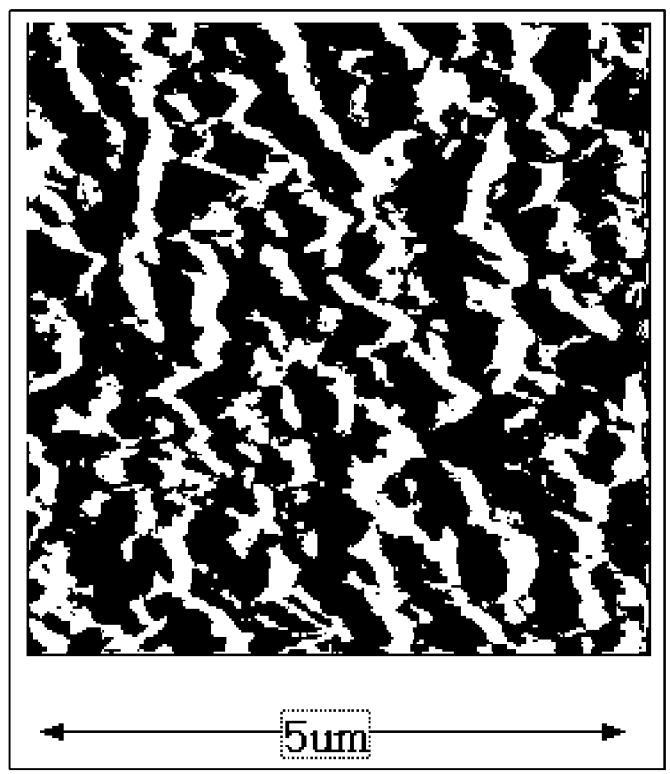
FIG. 11A is a picture showing a surface of an organic semiconductor layer according an embodiment of the present invention.
Figure 11B:
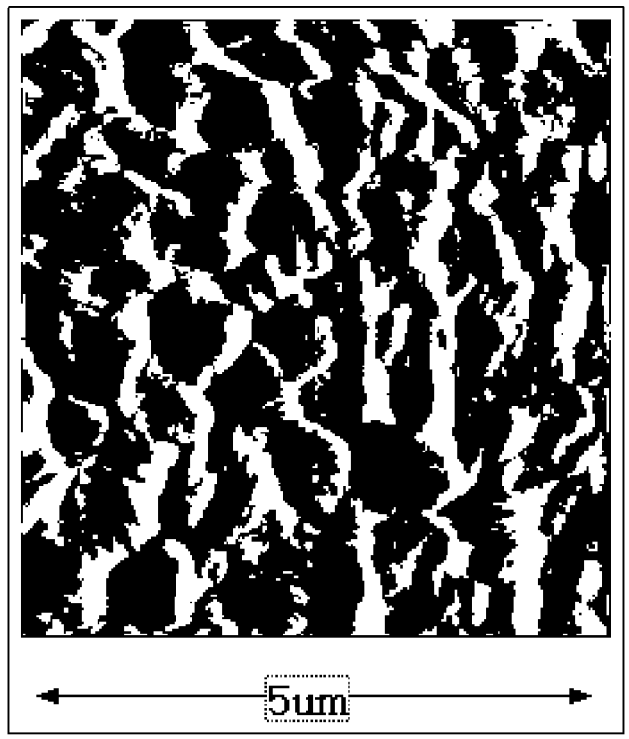
FIG. 11B is a picture showing a surface of an organic semiconductor layer according to the embodiments of FIGS. 1 and 2 and FIGS. 1 and 4.
Figure 11C:
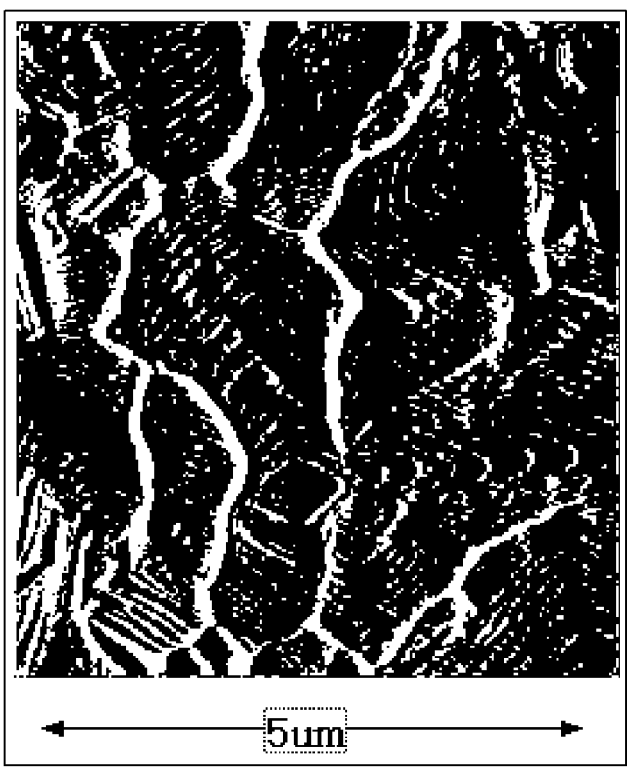
FIG. 11C is a picture showing a surface of an organic semiconductor layer according to the embodiments of FIGS. 1 and 6 and FIGS. 1 and 8.

FIG. 11A is a picture showing a surface of an organic semiconductor layer according to a conventional one; FIG. 11B is a picture showing a surface of an organic semiconductor layer according to the embodiments of FIGS. 1 and 2 and FIGS. 1 and 4. FIG. 11C is a picture showing a surface of an organic semiconductor layer according to the embodiments of FIGS. 1 and 6 and FIGS. 1 and 8.

Comparing FIGS. 11A, 11B, and 11C with each other, FIG. 11B shows larger grains than FIG. 11A and FIG. 11C shows much larger gains than FIG. 11B. Increased grain size of semiconductor increases mobility of electrons and ratio of on and off current (Ion/Ioff), improving TFT performance.

Table 1 shows mobility of electrons and Ion/Ioff depending on materials of the under layer when pentacene is used as an organic semiconductor. Table 2 shows mobility of electrons and Ion/Ioff depending on materials of the under layer when poly3-hexylthiophene (P3HT) is used as an organic semiconductor.

TABLE 1

Pentacene is used as an organic semiconductor.

| Gate insulator | Mobility ($cm^2$/Vs) | Ion/Ioff |
|---|---|---|
| OTS treated on $SiO_2$ | 0.2 | $10^5$ |
| m-CEP | 0.21 | $10^5$ |

TABLE 2

P3HT is used as an organic semiconductor.

| Gate insulator | Mobility ($cm^2$/Vs) | Ion/Ioff |
|---|---|---|
| OTS treated on $SiO_2$ | 0.01 | $10^2$ |
| m-CEP | 0.6 | $10^2$ |

In the above-described embodiments, the gate insulator 140 made of OTS treated $SiO_2$ or peculiar organic insulating materials is formed in an island type under the organic semiconductor. It is because the high price and dielectric constant of the OTS treated $SiO_2$ and peculiar organic insulating materials. High dielectric constant an insulator between wires may cause such problems as excessive RC delay due to increased parasitic capacitance between wires.

While the present invention has been described in detail with reference to the preferred embodiments, those skilled in the art will appreciate that various modifications and substitutions can be made thereto without departing from the spirit and scope of the present invention as set forth in the appended claims.

What is claimed is:
1. A thin film transistor substrate, comprising;
a substrate;
a gate electrode disposed on the substrate;
a first insulating layer disposed on the substrate and having a trench exposing the gate electrode:
a gate insulating layer disposed on the gate electrode in the trench of the first insulating layer; wherein the gate insulating layer comprises at least one of maleimide-styrene, polyvinylphenol and modified cyanoethylpullulan;
an organic semiconductor layer disposed on the gate insulating layer in the trench of the first insulating layer;
a source electrode and a drain electrode disposed on the organic semiconductor layer;
a passivation layer disposed on the substrate with a contact hole exposing the drain electrode;
a pixel electrode disposed on the passivation layer contacting the drain electrode via the contact hole, wherein the gate electrode and the gate insulating layer are disposed within the trench.

2. The thin film transistor substrate of claim 1, wherein the trench formed in the first insulating layer has an inclined sidewall.

3. The thin film transistor substrate of claim 1,
wherein the organic semiconductor layer comprises one of a derivative including substituent of tetracene or pentacene, oligothiophene formed by connecting connection location number 2 and 5 of 4 to 8 thiophene ring, perylenetetracarboxylic dianhydride (PTCDA), imide derivative of PTCDA, napthalenetetracarboxylic dianhydride (NTCDA), imide derivative of NTCDA, metalized pthalocyanine, derivative halide of metalized pthalocyanine, perylene, coroene, defivative including substituent of coroene, co-oligomer or co-polymer of thienylene and vinylene, thiophene, perylene, coroene, derivative including substituent of perylene and coroene, derivative including aromatic or heteromatic ring, derivative including one or more of hydrocarbon chain having one to thirty carbon.

\* \* \* \* \*